United States Patent
Zeng et al.

(10) Patent No.: US 7,763,969 B2
(45) Date of Patent: Jul. 27, 2010

(54) STRUCTURE WITH SEMICONDUCTOR CHIPS EMBEDED THEREIN

(75) Inventors: Zhao-Chong Zeng, Hsin-chu (TW); Shi-Ping Hsu, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 681 days.

(21) Appl. No.: 11/588,912

(22) Filed: Oct. 27, 2006

(65) Prior Publication Data

US 2007/0145577 A1  Jun. 28, 2007

(30) Foreign Application Priority Data

Dec. 23, 2005 (TW) .............................. 94146005 A

(51) Int. Cl.
*H01L 23/12* (2006.01)
*H01L 21/4763* (2006.01)

(52) U.S. Cl. .................. 257/700; 257/724; 257/758; 257/774; 257/E21.602; 438/622

(58) Field of Classification Search .................. None
See application file for complete search history.

(56) References Cited

U.S. PATENT DOCUMENTS

| 5,432,677 | A | * | 7/1995 | Mowatt et al. | 361/719 |
| 6,423,570 | B1 | * | 7/2002 | Ma et al. | 438/106 |
| 6,506,632 | B1 | * | 1/2003 | Cheng et al. | 438/126 |
| 2006/0049530 | A1 | * | 3/2006 | Hsu | 257/784 |
| 2006/0087037 | A1 | * | 4/2006 | Hsu | 257/738 |
| 2006/0128069 | A1 | * | 6/2006 | Hsu | 438/124 |
| 2007/0138630 | A1 | * | 6/2007 | Wang et al. | 257/723 |

* cited by examiner

*Primary Examiner*—Alonzo Chambliss
(74) *Attorney, Agent, or Firm*—Sawyer Law Group, P.C.

(57) ABSTRACT

An embedded semiconductor chip structure and a method for fabricating the same are proposed. The structure comprises: a carrier board, therewith a plurality of through openings formed in the carrier board, and through trenches surrounding the through openings in the same; a plurality of semiconductor chips received in the through openings of the carrier board. Subsequently, cutting is processed via the through trenches. Thus, the space usage of the circuit board and the layout design are more efficient. Moreover, shaping time is also shortened.

7 Claims, 4 Drawing Sheets

STRUCTURE WITH SEMICONDUCTOR CHIPS EMBEDED THEREIN

BACKGROUND OF THE INVENTION

1. Field of the Invention

The present invention relates to a structure with semiconductor chips embedded therein and a method of fabricating the same, and more particularly, to a structure with the semiconductor chip embedded and the circuit layer integrated therein, and a method of formation thereof.

2. Background of the Invention

Due to the rapid growth in the electronic industry, electronic devices have gradually been developed towards the directions of multi-function, high speed, and high frequency. In the demand of high integration and miniaturization, semiconductor packages have evolved gradually from a single chip ball grid array (BGA) package or flip chip (FC) package to the types of multi-chip package and module package, such as System in Package (SiP), System Integrated Package (SIP) and System in Board (SiB).

These types of multi-chip package and module package are formed by attaching each semiconductor chip on the carrier board one by one using the flip-chip, the wire-bonding, or the SMT techniques. Although these techniques can admit high number of leads, when they perform under high frequency or high speed, the conductive paths may be too long, which limit the electrical efficiency. In addition, since multiple interfaces are required in these conventional techniques, the production cost is increased corresponsively.

Accordingly, to efficiently increase the electrical quality for the electronic devices of the next generation, a method of embedding semiconductor chip in a carrier board to achieve direct electrical connection is often adopted in the industry, so as to reduce the electrical transmission path, thereby reducing the loss of electrical signals and the distortion of the same, and improving the capability of high speed operation.

As shown in FIG. 1, a cross-sectional view of a conventional package with semiconductor chips embedded therein is shown. As shown in the drawing, the package comprises: a carrier board 10, which has at least one opening 100a formed on one surface 100 thereof; at least one semiconductor chip 11 having an inactive surface 11b and an opposing active surface 11a, on which a plurality of electrode pads 110 are formed, and therewith the semiconductor chip 11 received in the opening 100a of the carrier board 10; a built-up structure 12 formed on the carrier board 10, which is electrically connected to the electrode pads 110 of the semiconductor chip 11 through a plurality of conductive vias 120. The inactive surface 11b of the semiconductor chip 11 is attached into the opening 100a of the carrier board 10 via an adhesive 13.

The built-up structure 12 comprises at least one insulating layer 121, at least one circuit layer 122 stacked on the insulating layer 121 and a plurality of conductive vias 120 in the insulating layer 121 to electrically connect the circuit layer 122. The outermost surface of the built-up structure 12 has a plurality of electrical connecting pads 123 and the outermost built-up structure is covered with a solder mask layer 124. The solder mask layer 124 has a plurality of openings for exposing the electrical connecting pads 123, which can be mounted with the solder balls 125.

However, in order to save production cost, a plurality of semiconductor chips are often embedded in a carrier board. Then after a circuit manufacturing completed to form a circuit to thereby extend electrical connections for the semiconductor chip, a cutting process on the carrier board is performed to carry out individual package with a semiconductor chip embedded therein. Nevertheless, in the foregoing method, a space must be preserved in the layout design on the carrier board for the subsequent cutting process using the shaping machine, as a router. Since the shaping machine is relatively large, the preserved space of the carrier board must also be large, thus reducing the usable layout space of the carrier board, and increasing the production cost.

Furthermore, after the semiconductor chip has been embedded in the carrier board following the foregoing method, a process of circuit patterning is carried out on only one surface of the substrate. This makes the two opposing surfaces of the package suffer from unbalanced stresses, thereby causing warpage of the carrier board during the process, as well as reducing product yield.

Moreover, in the conventional process, the shaping machine performs cutting on the carrier board directly, thus the shaping time can not decrease. In addition, as the circuit is made of copper which is highly extensible upon stress exerted by the shaping machine, it may cause scratch of the adjacent semiconductor packages after the cutting process, resulting in damages in the package and reduction in the product yield.

Thus, there is an urgent need for the industry to develop a structure with semiconductor chips embedded therein and a method of fabricating the same, in which the problems such as reduction in usable space of the carrier board, inefficient layout design, substrate warpage, damages in semiconductor package, low product yield, increased cost, and increased time for shaping can be solved.

SUMMARY OF THE INVENTION

In light of the drawbacks of the prior arts described above, a primary objective of the present invention is to provide a structure with semiconductor chips embedded therein and a fabricating method thereof, for efficient layout of the chip carrier board and increasing usable space of the carrier board.

Another objective of the invention is to provide a structure with semiconductor chips embedded therein and a fabricating method thereof, to thereby balance out the stresses exerted on the carrier board during the fabricating process, thus preventing the occurrence of warpage which damages the overall package structure.

Further objective of the invention is to provide a structure with semiconductor chips embedded therein and a fabricating method thereof, for increasing yield, reducing the cost and shaping time.

To achieve the foregoing and other objectives, the present invention proposes a method of fabricating a structure with semiconductor chips embedded therein, comprising: providing a carrier board having a first surface and an opposing second surface, therewith forming both a plurality of through openings in the carrier board, and first trenches on the first surface thereof surrounding the through openings without penetrating the carrier board; providing a first dielectric layer, and putting the first surface of the carrier board on the first dielectric layer; disposing a semiconductor chip within each of the through openings of the carrier board, wherein the semiconductor chip has an active surface and an opposing inactive surface, which likewise is put on the first dielectric layer, and then pressing to bond together the carrier board, the semiconductor chip, and the first dielectric layer, so that the first dielectric layer fills the first trenches, as well as the gap between the semiconductor chip and the carrier board; and forming second trenches on the second surface of the carrier board at the positions corresponding to the first trenches, thereby interconnecting mutually to form through trenches in the carrier board.

The foregoing method further comprises: forming a second dielectric layer both on the second surface of the carrier board and on the active surface of the semiconductor chip, so that the second dielectric layer fills the second trenches; and forming a plurality of conductive vias in the second dielectric layer, as well as forming a circuit layer on the second dielectric layer, wherein the conductive vias electrically connect to the active surface of the semiconductor chip. Moreover, the method also comprises: forming a metal layer on the outer surface of the first dielectric layer at the same time as forming the circuit layer on the second dielectric layer.

In addition, forming a built-up structure on the second dielectric layer and on the circuit layer, which electrically connects with the circuit layer, wherein at the same time as forming the built-up circuit layer, another metal layer is successively stacked on the metal layer so as to form a metallic board with a multi-layer structure.

Furthermore, the method comprises forming a solder mask layer on the built-up structure, wherein the solder mask layer has a plurality of openings, to thereby expose the connecting pads of the built-up structure, and forming openings in the metallic board at the positions corresponding to the through trenches. After a cutting process via the through trenches, a plurality of packages are formed, each having a structure with the semiconductor chip embedded and the circuit layer integrated therein, wherein some residual of the first dielectric layer is present around the periphery of the package.

The present invention also proposes a structure with semiconductor chips embedded therein, comprising: a carrier board having a first surface and an opposing second surface, therewith a plurality of through openings formed in the carrier board, and through trenches surrounding the through openings formed in the same; a plurality of semiconductor chips, which have an active surface and an opposing inactive surface each, received in the through openings of the carrier board; and a first dielectric layer formed on the first surface of the carrier board, filling the gap between the semiconductor chip and the carrier board, as well as parts of the through trenches.

The foregoing structure further comprises: a second dielectric layer formed on the second surface of the carrier board and on the active surface of the semiconductor chip, also filling the residual spaces of the through trenches; and a circuit layer formed on the second dielectric layer, together with a plurality of conductive vias formed in the second dielectric layer, to thereby electrically connect to the active surface of the semiconductor chip.

Subsequently, a built-up structure can be formed on the second dielectric layer and the circuit layer. The built-up structure is electrically connected to the circuit layer.

Besides, the structure of the invention comprises a metallic board formed on the outer surface of the first dielectric layer, and openings are formed in the metallic board at the positions corresponding to the through trenches, which are then used for a cutting process to thereby form a plurality of packages, each having a structure with the semiconductor chip embedded and the circuit layer integrated therein, wherein some residual of the first dielectric layer is present around the periphery of the package.

BRIEF DESCRIPTION OF THE DRAWINGS

The present invention can be more fully comprehended by reading the detailed description of the preferred embodiment listed below, with reference to the accompanying drawings, wherein.

DETAILED DESCRIPTION OF THE PREFERRED EMBODIMENTS

Preferred embodiments of the present invention will be described in detail below while referring to FIGS. 2A-2I.

Figure 1:
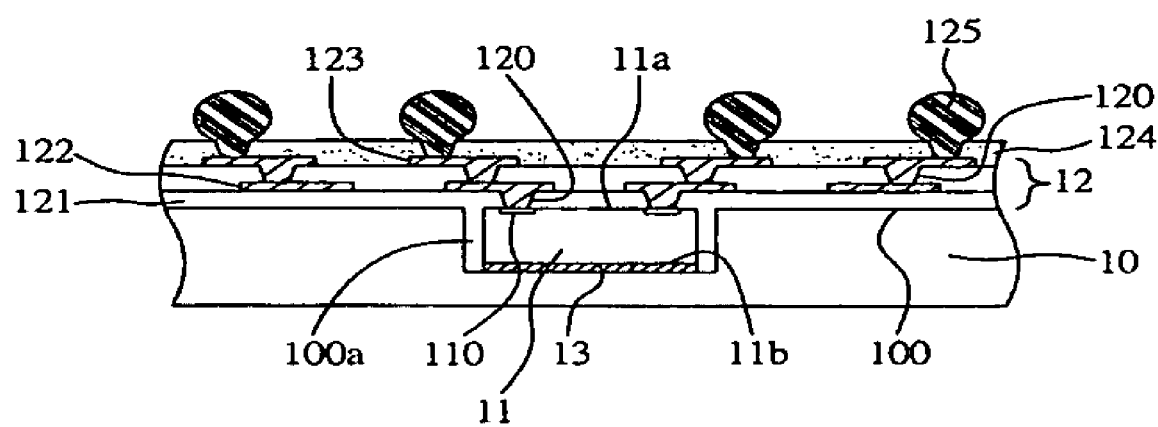
FIG. 1 (PRIOR ART) is a schematic cross-sectional diagram showing a conventional package with a semiconductor chip embedded therein.
Figure 2A:
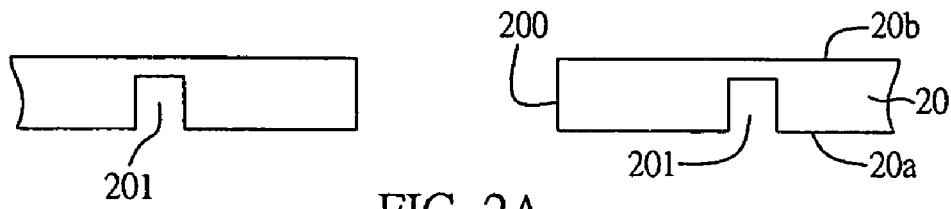
FIGS. 2A-2I are schematic cross-sectional diagrams showing the method in accordance with an embodiment of the present invention.

As shown in FIG. 2A, firstly a carrier board 20 is provided. The carrier board 20 has a first surface 20a and an opposing second surface 20b, therewith forming a plurality of through openings 200 therein, together with first trenches 201 on the first surface 20a thereof surrounding the through openings 200 without penetrating the carrier board 20. The foregoing carrier board 20 can be a heat sink made of metal or an insulating board made of BT resin, RF4 resin, epoxy resin, glass fibre, polyimide, cyanate ester or a circuit board having circuit structure. In the present invention, the first trenches 201 are formed by etching or routing.

Figure 2B:
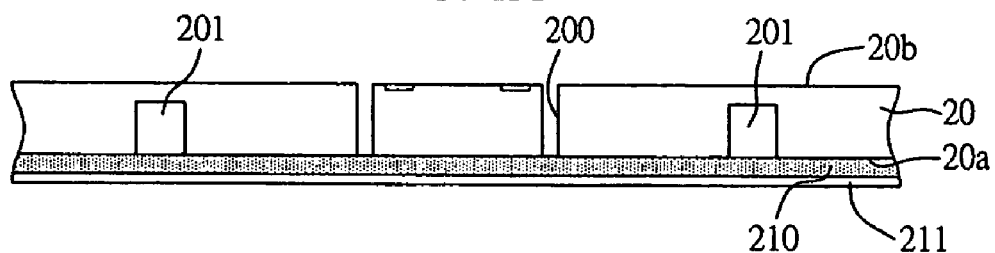
Figure 2C:
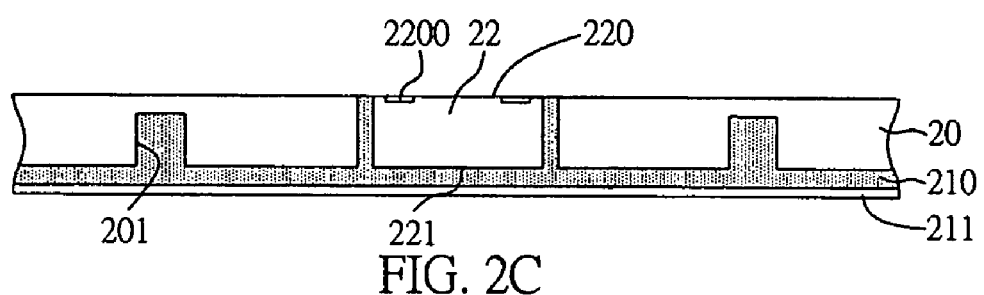

As shown in FIGS. 2B and 2C, a first dielectric layer 210 is provided, and then the first surface 20a of the carrier board 20 is put on the first dielectric layer 210; a semiconductor chip 22 is disposed within each of the through openings 200 of the carrier board 20, wherein the semiconductor chip 22 has an active surface 220 and an opposing inactive surface 221, which likewise is put on the first dielectric layer 210. A removable protective film (not shown in the figures) is attached onto both the second surface 20b of the carrier board 20 and the active surface 220 of the semiconductor chip 22, and then press to bond together the carrier board 20, the semiconductor chip 22, and the first dielectric layer 210, so that the first dielectric layer 210 fills the first trenches 201, as well as the gap between the semiconductor chip 22 and the carrier board 20, therewith the semiconductor chip 22 fixed in position within the through opening 200 of the carrier board 20 via the first dielectric layer 210.

The first dielectric layer 210 can be made of epoxy resin, polyimide, cyanate ester, ajinomo build-up film, bismaeleimide triazine (BT) or a mixed epoxy resin and FR5 glass fiber; and the first dielectric layer 210 can further comprise a metal film 211 formed on one surface thereof, which is not in contact with the carrier board 20. The metal film 211 is preferably made of copper (Cu) which has high conductivity and can be pressed or deposited on the first dielectric layer in advance. To provide a good adhesion for a subsequent electroplating to form metal layers, it is preferred to apply a surface roughness treatment on the surface of the first dielectric layer 210 before the formation of the metal film 211.

A plurality of electrode pads 2200 are formed on the active surface 220 of the semiconductor chip 22.

Figure 2D:
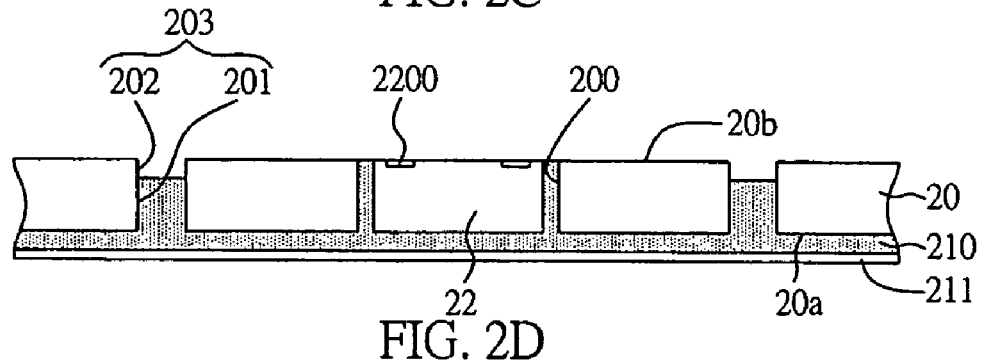

As shown in FIG. 2D, a plurality of second trenches 202 are formed on the second surface 20b of the carrier board 20 at the positions corresponding to the first trenches 201, to thereby interconnect mutually to form through trenches 203 in the carrier board 20 for a subsequent cutting process using the shaping machine, such as a router. Accordingly, the space of the carrier board can be more efficiently used, improving the efficiency of circuit layout. Moreover the through trenches 203 with the use of shaping machine allows simple cutting process to be achieved to carry out a single semiconductor package with a semiconductor chip 22 embedded therein, thereby reducing the shaping time and the cost.

Figure 2E:
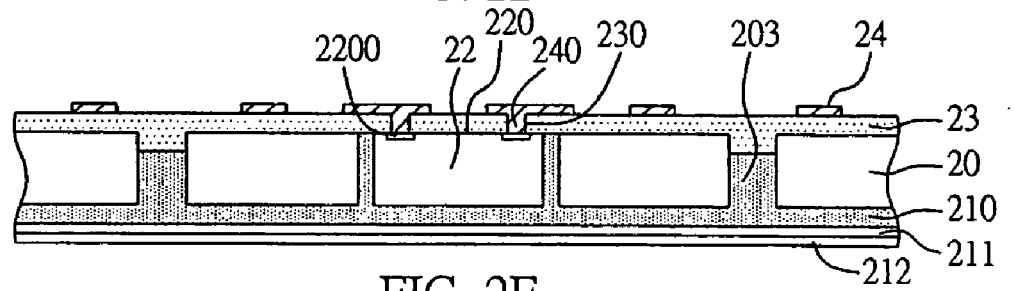

As shown in FIG. 2E, a second dielectric layer 23 is pressed onto the second surface 20b of the carrier board 20 and on the active surface 220 of the semiconductor chip 22, and fills the second trenches 202. A plurality of openings 230 are formed in the second dielectric layer 23 to expose the electrode pads 2200 of the semiconductor chip 22. A plurality of conductive vias 240 are formed in the second dielectric layer 23, as well as a circuit layer 24 is formed on the same, wherein the conductive vias 240 electrically connect to the electrode pads 2200.

In addition, at the same time as forming the circuit layer 24, it is also applicable to form a metal layer 212 (such as a copper layer) on the metal film 211 on the outer surface of the first dielectric layer 210 through a plating process.

Figure 2F:
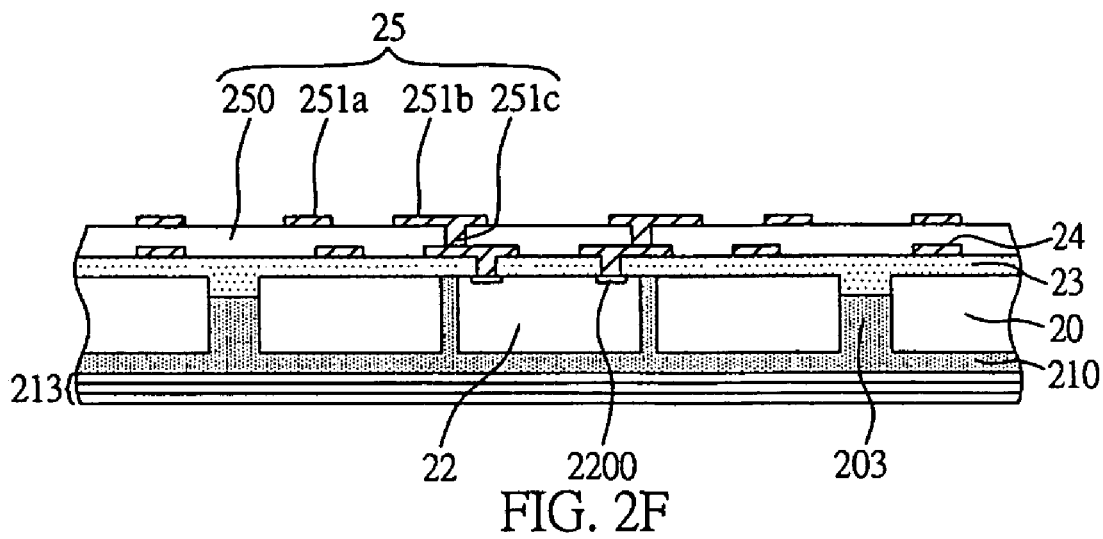

As shown in FIG. 2F, a build-up process can be performed selectively according to the practical needs, to form a built-up structure 25 on the second dielectric layer 23 and on the circuit layer 24, comprising: at least a dielectric layer 250, at least a built-up circuit layer 251a stacked on the dielectric layer 250, a plurality of connecting pads 251b, and a plurality of conductive vias 251c, to thereby electrically connect to the circuit layer 24.

Besides, at the same time as forming the built-up circuit layer 251a, it is also applicable to stack another metal layer successively on the metal layer 212 through plating process, so as to form a metallic board 213 with a multi-layer structure. The metallic board 213 is used as a heat sink for dissipating heat generated from the semiconductor chip 22, and furthermore, the metallic board 213 as well as the first dielectric layer 210 serves to balance out the stresses exerted on the carrier board during the build-up process, thereby preventing the occurrence of warpage which damages the overall package structure, thus increasing the product yield and reducing the cost.

Figure 2G:
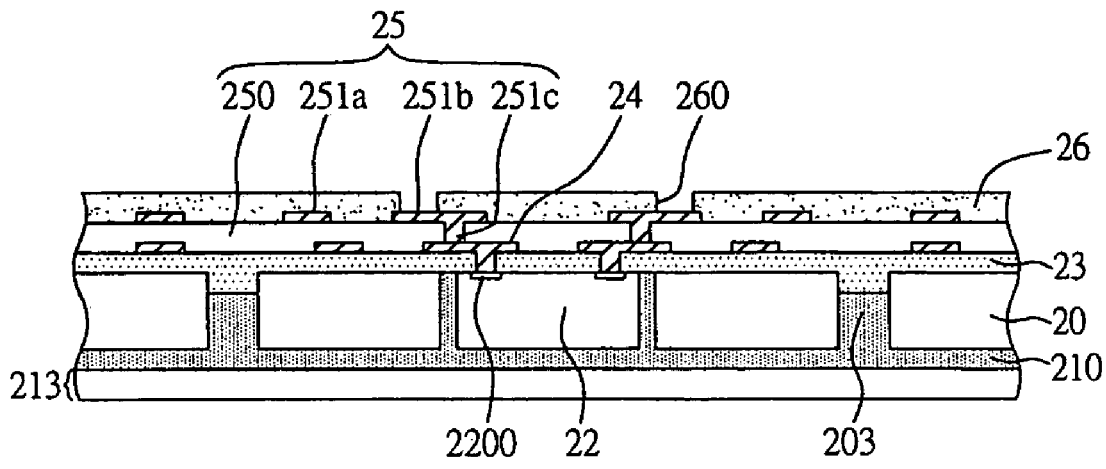

As shown in FIG. 2G, a solder mask layer 26 can be formed on the outer surface of the built-up structure 25, wherein the solder mask layer 26 has a plurality of openings 260, to thereby expose the connecting pads 251b of the outermost circuit in the built-up structure 25. Moreover, conductive elements can then be attached to the connecting pads 251b, thereby extending the electrical connection of the semiconductor chip towards outside of the package.

Figure 2H:
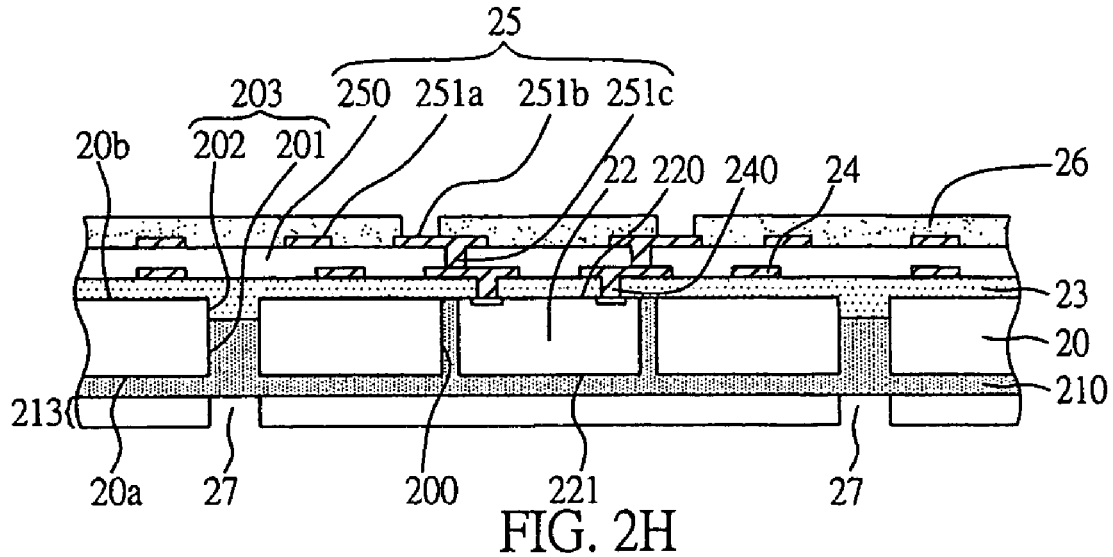
Figure 2I:
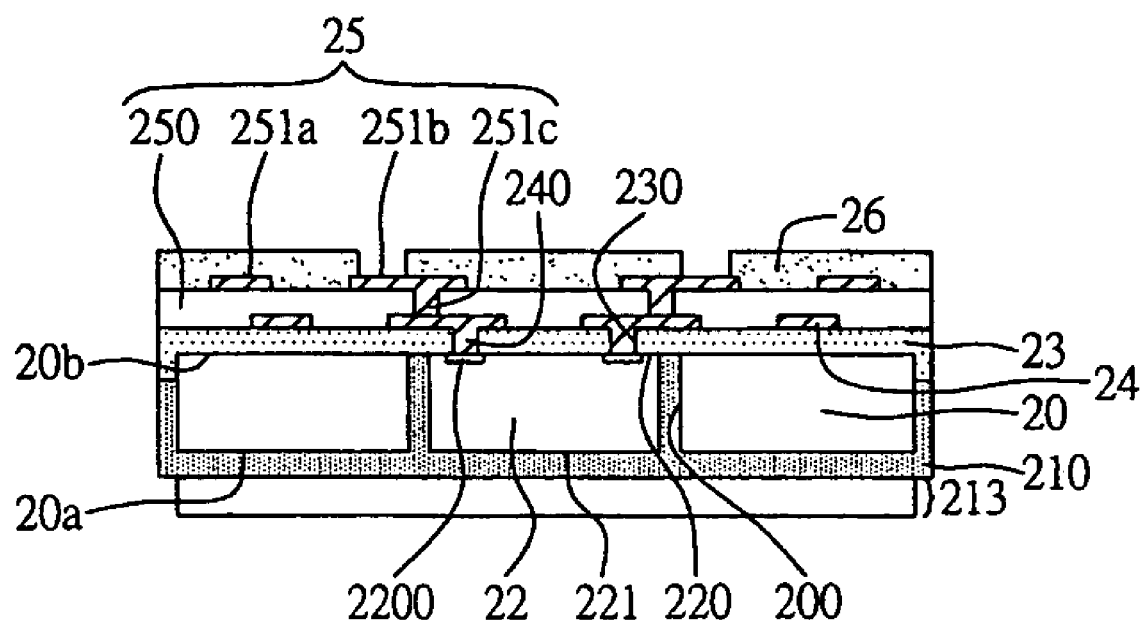

As shown in FIG. 2H, openings 27 are formed in the metallic board 124 at the positions corresponding to the through trenches 203 for a subsequent cutting process. FIG. 2I shows one of a plurality of packages carried out through the cutting process, with the semiconductor chip 22 embedded and the circuit layers 24, 251a integrated therein, wherein some residual of the first dielectric layer 210 is present around the periphery of the package.

The present invention also proposes a structure with semiconductor chips embedded therein, as shown in FIG. 2H, comprising: a carrier board 20 having a first surface 20a and an opposing second surface 20b, therewith a plurality of through openings 200 formed in the carrier board 20, together with through trenches 203 formed in the same surrounding the through openings 200; a plurality of semiconductor chips 22, which have an active surface 220 and an opposing inactive surface 221 each, received in the through openings 200 of the carrier board 20; and a first dielectric layer 210 formed both on the first surface 20a of the carrier board 20 and on the inactive surface 221 of the semiconductor chips 22 each, filling the gaps between the semiconductor chips 22 and the carrier board 20, as well as parts of the through trenches 203.

The foregoing structure further comprises: a second dielectric layer 23 formed both on the second surface 20b of the carrier board 20 and on the active surface 220 of the semiconductor chips 22 each, also filling the residual spaces of the through trenches 203; and a circuit layer 24 formed on the second dielectric layer 23, together with a plurality of conductive vias 240 formed in the same, to thereby electrically connect to the active surface 220 of the semiconductor chip 22.

Subsequently, a built-up structure 25 can be formed on the second dielectric layer 23 and the circuit layer 24. The built-up structure 25 is electrically connected to the circuit layer 24.

Besides, the structure of the invention comprises a multi-layer metallic board 213 formed on the outer surface of the first dielectric layer 210, and openings 27 are formed in the metallic board 213 at the positions corresponding to the through trenches 203, which are then used for a cutting process to thereby form a plurality of packages, each having a structure with the semiconductor chip 22 embedded and the circuit layer 24, 251 integrated therein, wherein some residual of the first dielectric layer 210 is present around the periphery of the package, as shown in FIG. 2I.

In comparison with the conventional technology, the structure and the method of the present invention provides through trenches for cutting, to thereby effectively enhance the usable space of the carrier board.

In addition, after the carrier board is made up, the first and second dielectric material together fix the semiconductor chips in position within the carrier board, followed by forming the circuit layers on one side, along with a metallic board on the other side as a heat sink. Furthermore, the metallic board as well as the first dielectric layer serves to balance out the stresses exerted on the carrier board during the build-up process, to thereby reduce the occurrence of warpage, as well as increasing the product yield and reducing the cost.

Moreover, the through trenches in the carrier board provided for the subsequent cutting process also prevents reciprocal scratching and damage in adjacent semiconductor packages due to the extension of the circuit made of copper which is highly extensible upon stress exerted by the shaping machine.

While the preferred forms of the present invention have been described, it is to be understood that modifications will be apparent to those skill in the art without departing from the spirit of the invention. The scope of the invention, therefore, is to be determined solely by the following claims.

What is claimed is:

1. A structure with semiconductor chips embedded therein, comprising:
   a carrier board having a first surface and an opposing second surface, therewith a plurality of through openings formed in the carrier board, and through trenches surrounding the through openings formed in the same;
   a plurality of semiconductor chips having an active surface and an opposing inactive surface each, received in the through openings of the carrier board;
   a first dielectric layer formed on the first surface of the carrier board, and filling the gap between the semiconductor chip and the carrier and parts of the through trenches;
   a second dielectric layer formed on the second surface of the carrier board and on the active surface of the semiconductor chip, also filling the residual spaces of the through trenches;
   a circuit layer formed on the second dielectric layer, together with a plurality of conductive vias formed in the same, to thereby electrically connect to the active surface of the semiconductor chip; and
   a built-up structure formed on the second dielectric layer and on the circuit layer, wherein the built-up structure includes: at least a dielectric layer, at least a built-up circuit layer, a plurality of connecting pads, and a plurality of conductive vias, to thereby electrically connect to the circuit layer on the second dielectric layer.

2. The structure of claim 1, further comprising a metallic board formed on the outer surface of the first dielectric layer.

3. The structure of claim 2, further comprising openings formed in the metallic board at the positions corresponding to the through trenches.

4. The structure of claim 1, wherein the carrier board is one of a heat sink made of metal, an insulating board, and a circuit board.

5. A structure with a semiconductor chip embedded therein, comprising:
- a carrier board having a first surface and an opposing second surface, therewith a through opening formed in the carrier board;
- a semiconductor chip having an active surface and an opposing inactive surface, received in the through opening of the carrier board;
- a first dielectric layer formed on the first surface of the carrier board, and some residual of the first dielectric layer is present around the periphery of the carrier board;
- a second dielectric layer formed on the second surface of the carrier board and on the active surface of the semiconductor chip;
- a circuit layer formed on the second dielectric layer, together with a plurality of conductive vias formed in the same, to thereby electrically connect to the active surface of the semiconductor chip; and
- a built-up structure formed on the second dielectric layer and on the circuit layer, wherein the built-up structure includes: at least a dielectric layer, at least a built-up circuit layer, a plurality of connecting pads, and a plurality of conductive vias, to thereby electrically connect to the circuit layer on the second dielectric layer.

6. The structure of claim 5, further comprising a metallic board formed on the outer surface of the first dielectric layer.

7. The structure of claim 5, wherein the carrier board is one of a heat sink made of metal, an insulating board, and a circuit board.

\* \* \* \* \*